United States Patent
Wu et al.

(10) Patent No.: US 6,921,704 B1
(45) Date of Patent: Jul. 26, 2005

(54) METHOD FOR IMPROVING MOS MOBILITY

(75) Inventors: David Wu, Austin, TX (US); Akif Sultan, Austin, TX (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/700,557

(22) Filed: Nov. 5, 2003

(51) Int. Cl.[7] .............................................. H01L 21/76
(52) U.S. Cl. ...................... 438/421; 438/359; 438/422
(58) Field of Search ................................. 438/221, 296, 438/319, 359, 411, 421, 422

(56) References Cited

U.S. PATENT DOCUMENTS

| | | | |
|---|---|---|---|
| 5,098,856 A | 3/1992 | Beyer et al. | |
| 6,127,241 A | 10/2000 | Rha | |
| 6,165,843 A | * 12/2000 | Sung | 438/296 |
| 6,376,893 B1 | 4/2002 | Rha | |
| 6,406,975 B1 | 6/2002 | Lim et al. | |
| 6,613,652 B2 | * 9/2003 | Lim et al. | 438/311 |
| 6,620,703 B2 | * 9/2003 | Kunikiyo | 438/422 |
| 6,791,155 B1 | * 9/2004 | Lo et al. | 438/421 |

* cited by examiner

Primary Examiner—Kevin M. Picardat

(57) ABSTRACT

A method of forming a silicon-on-insulator semiconductor device including providing a substrate and forming a trench in the substrate, wherein the trench includes opposing side walls extending upwardly from a base of the trench. The method also includes depositing at least two insulating layers into the trench to form a shallow trench isolation structure, wherein an innermost of the insulating layers substantially conforms to the base and the two side walls of the trench and an outermost of the insulating layers spans the side walls of the trench so that a gap is formed between the insulating layers in the trench. The gap creates compressive forces within the shallow trench isolation structure, which in turn creates tensile stress within the surrounding substrate to enhance mobility of the device.

20 Claims, 5 Drawing Sheets

METHOD FOR IMPROVING MOS MOBILITY

FIELD OF THE INVENTION

The present invention relates to the manufacturing of semiconductor devices, and more particularly, to a trench isolation structure fabricated on a silicon substrate and a method for forming the trench isolation structure to improve MOS mobility.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor, for example. Types of MOS transistors include NMOS, PMOS and CMOS transistors. The MOS transistor is one of the basic building blocks of most modern electronic circuits.

Typically, semiconductor devices are comprised of millions of transistors formed above a semiconducting substrate. The semiconducting substrate or wafer includes an insulation layer, e.g., a buried oxide layer, above a semiconducting substrate of silicon. Typically, the insulation layer is formed by an oxidation process. Then, a process layer is formed above the insulation layer. The process layer may be formed by a variety of processes, e.g., by a chemical vapor deposition ("CVD") process.

Shallow trench isolation (STI) structures are provided, e.g., by etching, to create electrically isolated islands or bodies in the process layer. The semiconductor devices are then formed on the bodies of the process layer.

A typical method of fabricating a conventional STI structure in a silicon substrate is shown in FIGS. 1A–1D of the drawings. First, an insulation layer 11 and a process layer 12 are formed on a silicon substrate 10, and then patterned by means of conventional photolithographic and etching process to mask active (device) regions of the substrate. (The active regions are, by definition, the regions of the substrate masked by the insulation layer and the process layer, while the field regions are the regions of the substrate not so masked.) Trenches 13 are then selectively and anisotropically dry-etched in the field (isolation) regions of the substrate 10, as shown in FIG. 1A.

As shown in FIG. 1B, a conformal oxide film 14 is deposited onto the process layer 12 and onto the walls and floor of the trenches 13. The areas of the oxide film 14 which line the trenches 13 serve to repair damage suffered by the substrate when the trenches were etched.

As shown in FIG. 1C, a layer of dielectric 15 is then deposited in a suitable manner, such as by CVD onto the conformal oxide film 14 and within each of the trenches 13. The dielectric can comprise, for example, amorphous $SiO_2$ (known also as fused silica, undoped silica glass, or silica glass) and CVD-polysilicons. As shown in FIG. 1D, the dielectric 15 is etched-back until silica glass remains only within the lined trenches, thus completing fabrication of the trench isolation structures 19, each of which consists of the oxide film 14 (trench liner) within each of the trenches 13 and a dielectric 15 within each of the trench liners 14.

It is well known that tensile stress in the silicon layers surrounding the shallow trench isolation layers affects the mobility of the resulting MOS devices, especially for narrow devices. Increased tensile stress within the silicon layers can improve the mobility of the resulting MOS devices.

What is desired is improved performance of devices to address the ever growing need for improved overall performance. What is still desired is a new and improved shallow trench isolation structure and a method for forming a shallow trench isolation. Preferably, the improved shallow trench isolation structure will provide a desired amount of tensile stress in the surrounding silicon layers so that the mobility of the resulting devices can be improved.

SUMMARY OF THE INVENTION

This and other needs are met by embodiments of the present invention which provides a method of forming a silicon-on-insulator semiconductor device including methods for enhancing mobility of the device.

One exemplary embodiment of the invention includes providing a substrate and forming a trench in the substrate, wherein the trench includes opposing side walls extending upwardly from a base of the trench. The method also includes depositing at least two insulating layers into the trench to form a shallow trench isolation structure, wherein an innermost of the insulating layers substantially conforms to the base and the two side walls of the trench and an outermost of the insulating layers spans the side walls of the trench so that a gap is formed between the insulating layers in the trench. Among other features and benefits, the gap creates compressive forces within the shallow trench isolation structure, which in turn creates tensile stress within the surrounding substrate to enhance mobility of the semiconductor device.

According to one aspect of the present invention, the insulating layers comprise $SiO_2$. According to another aspect, the gap between the insulating layers in the trench is filled with air. According to an additional aspect, the gap is substantially sealed. According to a further aspect, the gap comprises between about 30% and about 50% of the cross-sectional area of the shallow trench isolation structure.

According to another aspect of the present invention, the trench is anisotropically dry-etched. According to one aspect, the trench has a depth of about 400–1,200 angstroms. According to a further aspect, the trench has a width of about 400–8,000 angstroms. According to an additional aspect, the trench has a trench angle of between about 70° and 85°.

According to yet another aspect of the present invention, the innermost of the insulating layers has a thickness of about 20–200 angstroms. According to a further aspect, the outermost of the insulating layers has a thickness of about 400–4,000 angstroms.

Additional aspects, feature and advantages of the present invention will become readily apparent to those skilled in this art from the following detailed description, wherein only an exemplary embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout. None of the figures briefly described below are drawn to scale. As is common in the art of integrated circuit representation, the thickness and lateral dimensions of the various structures shown in the figures were chosen only to enhance the legibility of the figures.

DETAILED DESCRIPTION OF THE INVENTION

FIGS. 2A–2E show an exemplary embodiment of a silicon-on-insulator semiconductor device 100 fabrication method carried out in accordance with the present invention. The method provides a shallow trench isolation (STI) structure 122 having a gap 120 formed therein. Among other features and benefits, the gap 120 creates compressive forces within the STI structure 122, which in turn creates tensile stress within the surrounding substrate 110 to enhance mobility of the semiconductor device 100.

Figure 3:
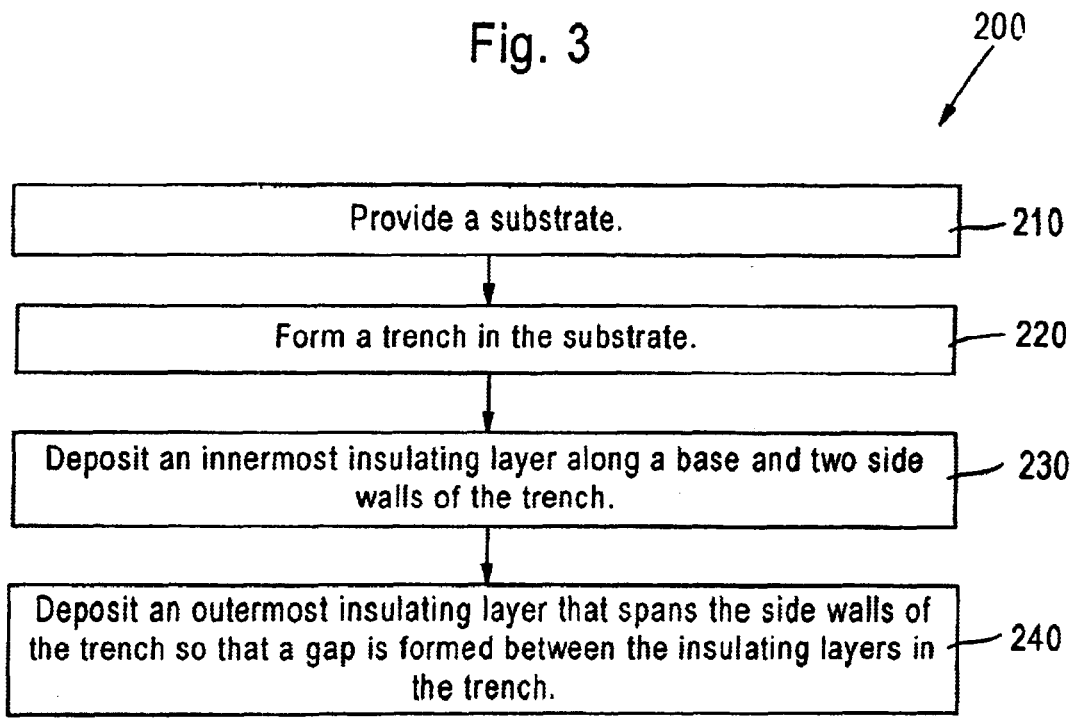
FIG. 3 is a flow chart of the method of FIGS. 2A–2E.

Referring first to FIG. 3, however, the method 10 of the present invention is summarized. The method 200 generally includes providing a substrate, as shown at 210, and forming a trench in the substrate, as shown at 220. The method also includes depositing an innermost insulating layer along a base and two side walls of the trench, as shown at 230, and depositing an outermost insulating layer that spans the side walls of the trench so that a gap is formed between the insulating layers in the trench, as shown at 240.

Referring back to FIG. 2A, an exemplary embodiment of a silicon-on-insulator semiconductor device 100 constructed in accordance with the method 200 of FIG. 3 is shown. First, constructing the semiconductor device 100 includes providing a substrate 110 and forming a buried oxide layer 111 on the substrate 110. In the exemplary embodiment of the present invention, the insulating layer comprises a buried oxide layer 111, which can be formed by ion implantation of oxygen in the substrate 110, for example. A thickness of the buried oxide layer 111 can be between about 500 angstroms and 2500 angstroms, for example (FIGS. 2A–2E are not to scale).

A process layer 112 is formed on the buried oxide layer 111. In the exemplary embodiment of the present invention, the process layer comprises a silicon nitride ($Si_3N_4$) layer 112. The process layer 112 is deposited using known, standard semiconductor processes. The thickness of the process layer 112 can be about 1000 angstroms, for example.

Figure 1A:
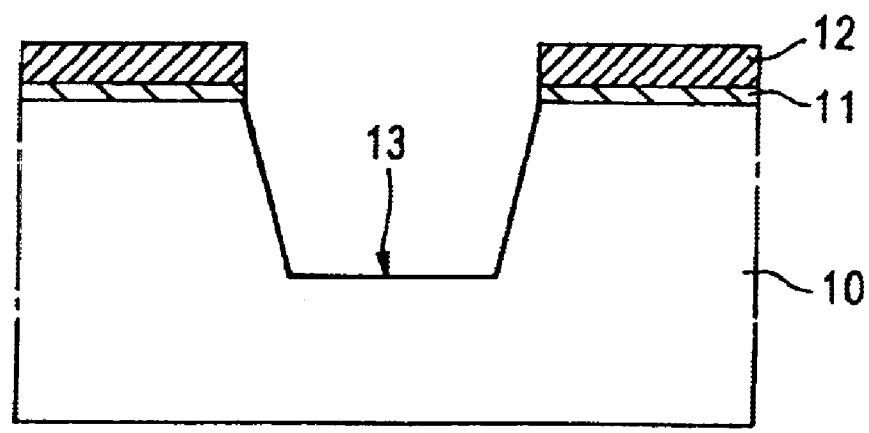
FIGS. 1A–1D are idealized cross-sectional views showing process steps of a typical method of fabricating conventional trench isolation structures in a silicon substrate.
Figure 1B:
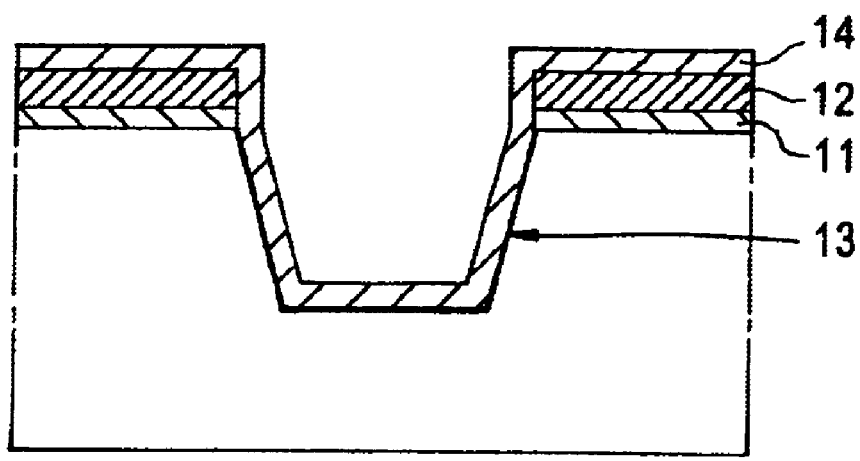
Figure 1C:
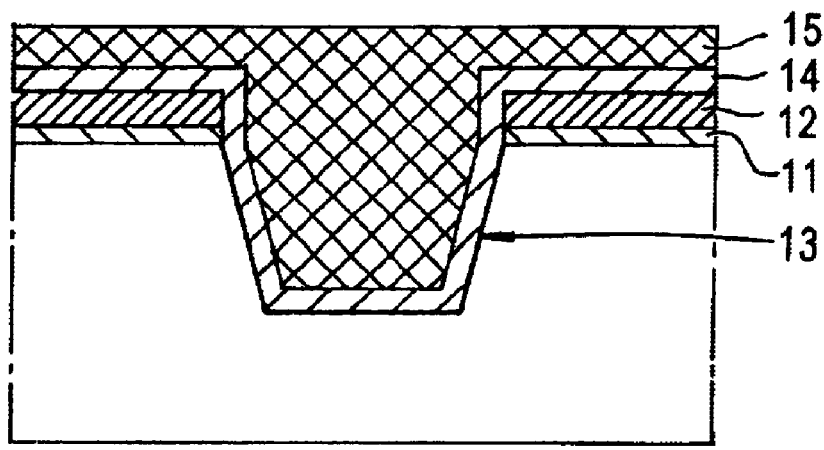
Figure 1D:
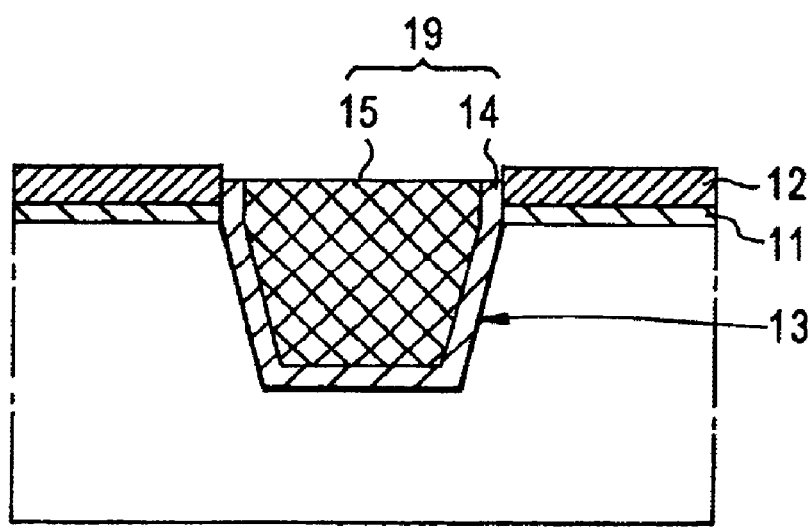
Figure 2A:
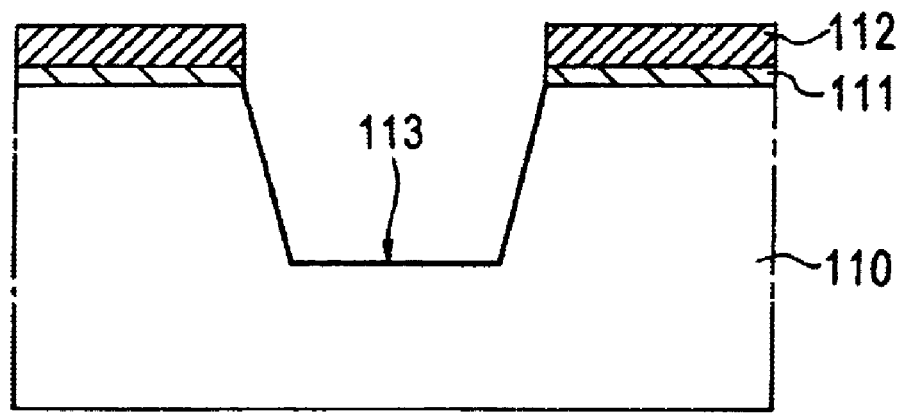
FIGS. 2A–2E are idealized cross-sectional views of trench isolation structures in a silicon substrate according to exemplary embodiments of the present invention.

Still referring to FIG. 2A, the process layer 112 and the buried oxide layer 111 are patterned by means of conventional photolithographic and etching process to mask active (device) regions of the substrate 110. (The active regions are, by definition, the regions of the substrate 110 masked by the process layer 112 and the buried oxide layer 111, while the field regions are the regions of the substrate not so masked.) Trenches 13 (only one is illustrated in the drawings figures) are then selectively and anisotropically dry-etched in the field (isolation) regions of the substrate 110, as shown in FIG. 2A.

According to one exemplary embodiment of the present invention, the trench has a depth to the base of about 500 angstroms, and a width between the side walls of about 1,200 angstroms. In addition, the trench has a trench angle of between about 70° and 85°.

Figure 2B:
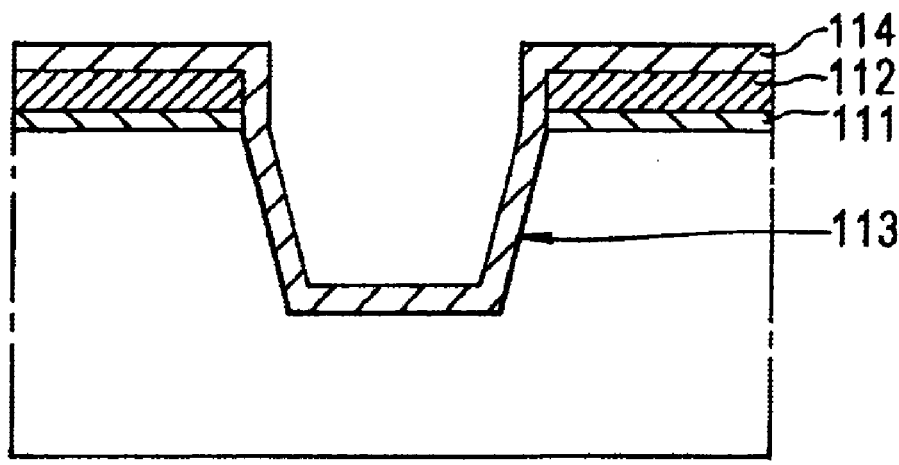

As shown in FIG. 2B, a conformal oxide film 114 can be deposited onto the process layer 112 and onto side walls and a base of the trench 113. The areas of the oxide film 114 which line the trench 113 serve to repair damage suffered by the substrate 110 when the trenches were etched. It should be understood, however, that the invention does not require the conformal oxide film 114.

Figure 2C:
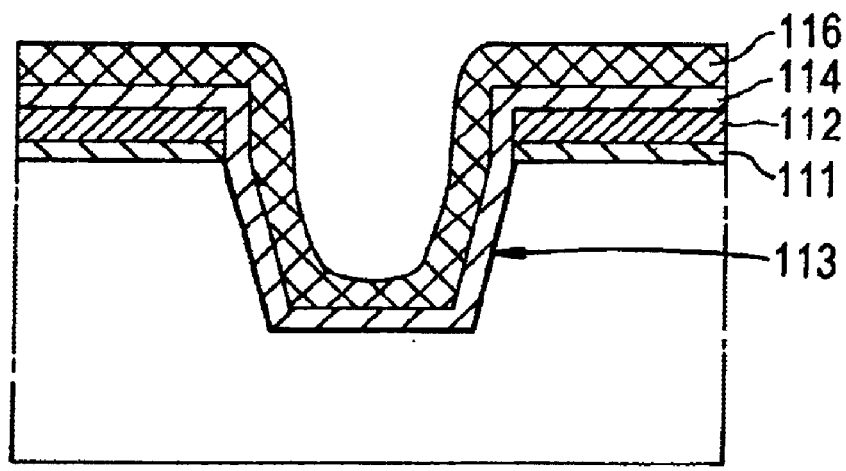
Figure 2D:
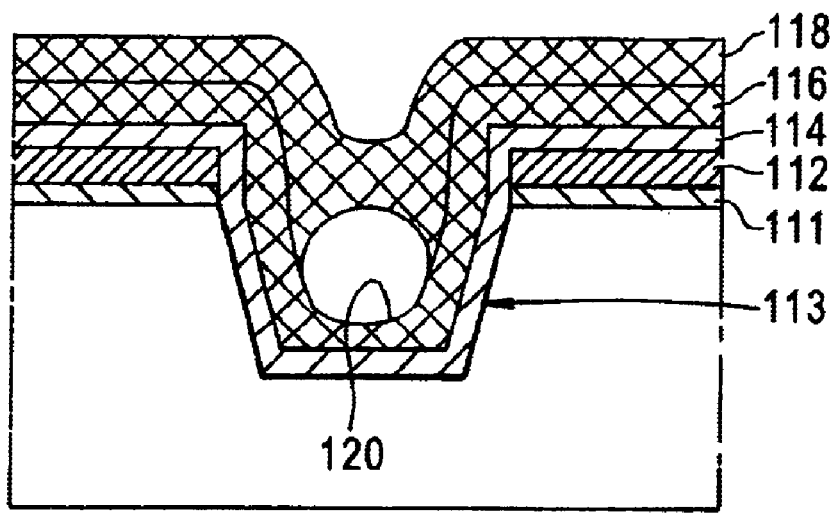

The invention does include depositing at least two insulating layers 116, 118 into the trench 113 to form a STI structure, as shown for example in FIGS. 2C and 2D. In the exemplary embodiment of FIGS. 2C and 2D, only two of the insulating layers 116, 118 are provided. However, an STI structure constructed in accordance with the present invention can include more than two layers. The insulating layers 116, 118 can comprise, for example, amorphous silicon dioxide ($SiO_2$), known also as fused silica, undoped silica glass, or silica glass, and chemical vapor deposition (CVD) polysilicons, and wherein the step coverage of the trench-fill process is manipulated.

An innermost insulating layer 116 is first deposited in a suitable manner, such as by CVD onto the conformal oxide film 114 and so that it substantially conforms to the side walls and the base of the trench 113, as shown in FIG. 2C. The innermost insulating layer 116 has a thickness of about 100 angstroms.

An outermost insulating layer 118 is than deposited over the innermost insulating layer 116 such that the outermost insulating layer 118 spans the side walls of the trench 113 so that a gap 120 is formed between the insulating layers 116, 118 in the trench 113, as shown in FIG. 2D. The outermost insulating layer 118 has a thickness of about 2,000 angstroms.

Although not shown in the drawings, the gap 120 extends longitudinally through the trench 113 such that the insulating layers 116, 118 in effect form a tube defining the gap 120. Among other features and benefits, the gap 120 creates compressive forces within the STI structure 122, which in turn creates tensile stress within the surrounding substrate 110 to enhance mobility of the semiconductor device 100.

Preferably, the gap 120 comprises between about 30% and about 50% of the cross-sectional area of the STI structure 122. In an exemplary embodiment, the gap 120 between the insulating layers 116, 118 in the trench 113 is substantially sealed and is filled with air. Alternatively, the gap 120 can comprise a vacuum or be filled with an alternative gas.

Figure 2E:
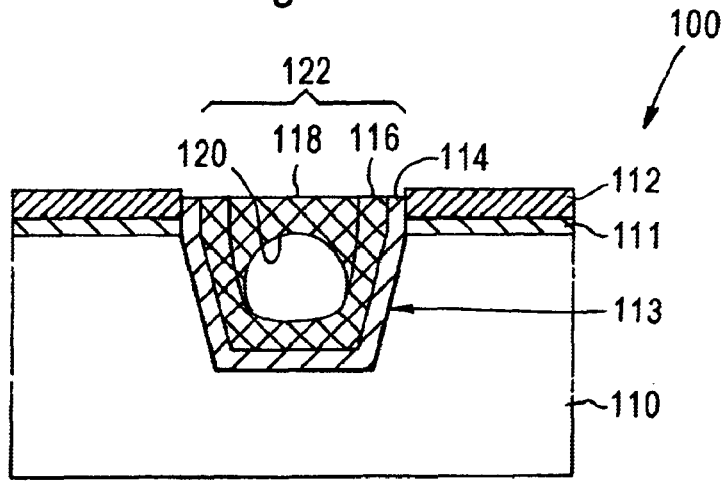

As shown in FIG. 2E, the conformal oxide film 114 and the insulating layers 116, 118 are then etched-back until they remain only within the lined trench 113, thus completing fabrication of the STI structure 122. Once the STI structure 122 is completed, further elements of the semiconductor devices 100 can then be formed over the process layer 112. For example, gate structures can be formed over the process layer 112, and drain and source regions can be formed in the process layer 112 below the gate structures (the STI structure 122 can alternatively be constructed during or after formation of additional elements such as gate structure).

The present invention, therefore, provides a new and improved STI structure 122, and a new and improved method 200 for improving mobility of a silicon-on-insulator (SOI) semiconductor device 100.

The present invention can be practiced by employing conventional materials, methodology and equipment. Accordingly, the details of such materials, equipment and methodology are not set forth herein in detail.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of forming a semiconductor device comprising:

providing a substrate;

forming a trench in the substrate, wherein the trench includes opposing side walls extending upwardly from a base of the trench;

depositing at least two insulating layers into the trench to form a shallow trench isolation structure, wherein an innermost of the insulating layers substantially conforms to the base and the two side walls of the trench and an outermost of the insulating layers spans the side walls of the trench so that a gap is formed between the insulating layers in the trench.

2. The method according to claim 1, wherein the insulating layers comprise $SiO_2$.

3. The method according to claim 1, wherein the gap between the insulating layers in the trench is filled with air.

4. The method according to claim 1, wherein the gap is substantially sealed.

5. The method according to claim 1, wherein the gap comprises a vacuum.

6. The method according to claim 1, wherein the gap comprises between about 30% and about 50% of the cross-sectional area of the trench.

7. The method according to claim 1, further comprising depositing a first conformal insulating film onto the base and the side walls of the trench prior to depositing the insulating layers.

8. The method according to claim 7, wherein the conformal insulating film comprises $Si_3N_4$.

9. The method according to claim 1, further comprising planarizing the outermost insulating layer to the substrate.

10. The method according to claim 1, further comprising forming a buried oxide layer on the substrate, forming a process layer on the buried oxide layer, and patterning channels in the process layer and the buried oxide layer to form isolation regions of the substrate prior to etching the trench in the isolation region of the substrate.

11. The method according to claim 10, wherein the process layer comprises $Si_3N_4$.

12. The method according to claim 10, wherein the process layer has a thickness of about 1000 angstroms.

13. The method according to claim 10, wherein the process layer is formed through a deposition process.

14. The method according to claim 10, wherein the buried oxide layer has a thickness of between about 500 angstroms and about 2500 angstroms.

15. The method according to claim 1, wherein the trench is anisotropically dry-etched.

16. The method according to claim 1, wherein the trench has a depth of about 500 angstroms.

17. The method according to claim 1, wherein innermost of the insulating layers has a thickness of about 100 angstroms.

18. The method according to claim 1, wherein outermost of the insulating layers has a thickness of about 2,000 angstroms.

19. The method according to claim 1, wherein the trench has a width of about 1,200 angstroms.

20. The method according to claim 19, wherein the trench has a trench angle of between about 70° and 85°.

* * * * *